United States Patent [19]

Arai

[11] Patent Number: 5,448,021

[45] Date of Patent: Sep. 5, 1995

[54] COPPER PLATING PROCESS AND WIRING BOARD

[75] Inventor: Keiji Arai, Kawasaki, Japan

[73] Assignee: Fujitsu Limited, Kanagawa, Japan

[21] Appl. No.: 234,877

[22] Filed: Apr. 28, 1994

[30] Foreign Application Priority Data

Aug. 12, 1993 [JP] Japan .................................. 5-200651

[51] Int. Cl.⁶ .............................................. H05K 01/00
[52] U.S. Cl. .................................... 174/257; 174/250; 174/256
[58] Field of Search ............... 174/250, 256, 257, 262, 174/266

[56] References Cited

U.S. PATENT DOCUMENTS 3,781,596 12/1973 Galli et al. .
4,713,494 12/1987 Oikawa et al. .

Primary Examiner—Leo P. Picard
Assistant Examiner—Cheryl R. Figlin
Attorney, Agent, or Firm—Armstrong, Westerman, Hattori, McLeland & Naughton

[57] ABSTRACT

An electroless nickel plating is used as a primer for electroplating of copper. Preferably, electroless nickel plating is conducted after the surface of aluminum is subjected to nickel substitution with a nickel salt under a strongly acidic condition (pH: 1 or less). More preferably, the nickel substitution is carried out after the oxide film on the surface of aluminum is removed.

1 Claim, 2 Drawing Sheets

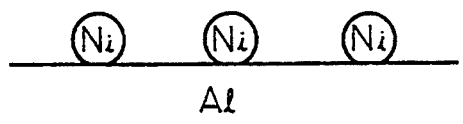
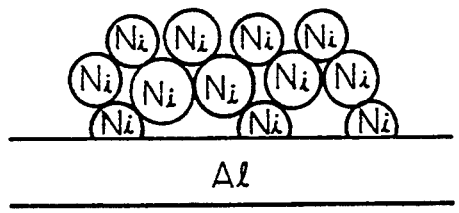
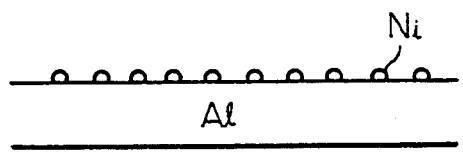
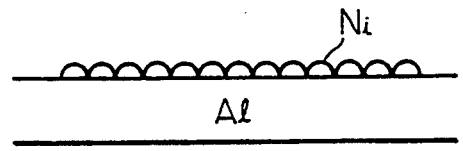
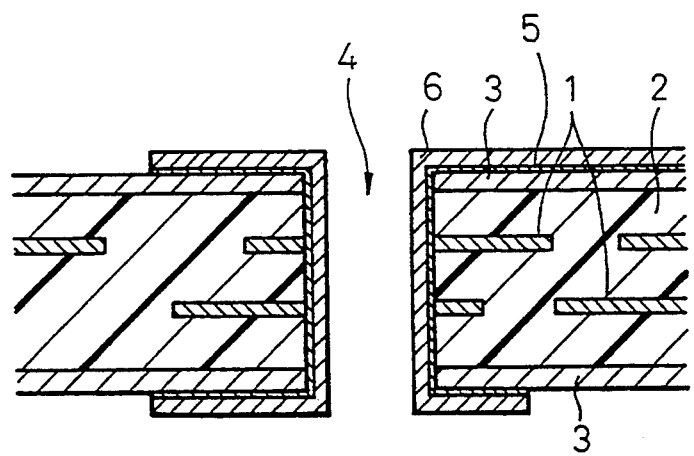

5,448,021

COPPER PLATING PROCESS AND WIRING BOARD

BACKGROUND OF THE INVENTION

1. Field of the Invention

The present invention relates to a process for copper plating of a wiring board and the thus obtained wiring board.

2. Description of the Related Art

A reduction in weight of electronic components in recent years has led to a demand for use of lightweight materials also for wiring boards. Aluminum, which is a metal having a relatively low electrical resistance and a low specific gravity, can be considered as a material capable of meeting the demand. However, the adhesion of copper plating onto aluminum is unsatisfactory, so that aluminum could not be used for wiring.

Accordingly, an object of the present invention is to provide a process for plating a wiring board with copper, which enables copper plating to have a high adhesion to aluminum even when aluminum is used in a conductive layer of the wiring board, and a wiring board produced by said process.

SUMMARY OF THE INVENTION

In order to attain the above-described object, the present invention provides a process for plating a wiring board with copper, wherein electroless nickel plating is effected as a pretreatment when aluminum used in a conductor of a wiring board (particularly an intermediate layer circuit of a multilayer printed wiring board) is plated with copper, and a wiring board produced by said process.

Specifically, according to an aspect of the present invention, there is provided a process for plating a wiring board with copper, comprising the steps of:

preparing a wiring board including an aluminum conductor as at least a part of conductors in said wiring board, said aluminum conductor having a portion exposed on the wiring board;

subjecting said exposed portion of said aluminum conductor to electroless nickel plating as a pretreatment; and then electroplating said electrolessly nickel-plated portion of said aluminum conductor with copper.

According to another aspect of the present invention, there is provided a wiring board comprising an aluminum conductor as at least a part of conductors, a copper plating provided on at least a part of said aluminum conductor and a nickel layer as a primer for said copper plating and provided on said aluminum conductor.

In the production of a wiring board, through-holes and the like should be plated with copper for the purpose of attaining good electrical conductivity, platability, solderability and other properties. In general, electroless copper plating is utilized as a pretreatment for electrolytic copper plating. In this case, however, when the substrate comprises aluminum, good adhesion of electroless copper plating to aluminum cannot be attained. On the other hand, it is known that nickel has excellent adhesion to copper. The present inventors have found that electroless nickel plating has a good adhesion also to aluminum, which has led to the completion of the present invention.

BRIEF DESCRIPTION OF THE DRAWINGS

FIGS. 1A to 1D are diagrams showing the function of nickel substitution in electroless nickel plating;

FIG. 2 is a schematic cross-sectional view of a multi-layer printed wiring board;

DESCRIPTION OF THE PREFERRED EMBODIMENTS

Figure 3:
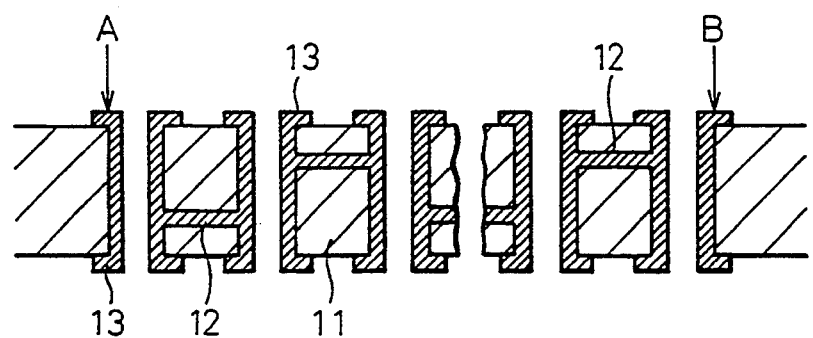
FIG. 3 vis an explanatory diagram of an electrical resistance measuring method for evaluating the adhesion of plating of through-holes.

In the wiring board to which the present invention is applied, aluminum is used as at least a part of conductors, and examples of such a wiring board include multi-layer wiring boards prepared by etching aluminum foil resin sheet on an insulating sheet with, for example, 10% hydrochloric acid (at 40° C.) to form a circuit and laminating a plurality of the sheets on top of one another.

With respect to through-hole plating in such wiring boards, aluminum wiring layers are exposed within the through-holes, and the through-hole plating is carried out for the purpose of electrically connecting the aluminum to a surface conductive layer (usually a copper circuit). As described above, electrolytic copper plating is effected as the through-hole plating. In this case, in the present invention, electroless nickel plating is effected as a pretreatment.

The present invention is directed mainly to through-hole plating. Since, however, the aluminum conductor is not limited to the intermediate layer but used also as at least a part of the surface layer, the present invention is useful also when the surface layer aluminum is plated with copper for wiring bonding purposes.

Electroless nickel plating methods are known in the art, and plating solutions for electroless nickel plating are commercially available. In general, after a multi-layer printed wiring board provided with through-holes is degreased, a catalyst, such as Pd/Sn, is imparted. Then, the wiring board is immersed in an electroless plating solution. An example of the commercially available catalyst solution for electroless nickel plating and the composition of the plating solution are as follows.

| Composition of commercially available catalyst solution: | |
|---|---|
| Palladium chloride | 0.1–0.3 g/liter |
| Stannous chloride | 10–20 g/liter |
| Hydrochloric acid (35% by volume) | 50–250 ml/liter |
| Sodium chloride | 20–200 ml/liter |
| Composition of commercially available electroless nickel plating solution: | |
| Nickel sulfate | 20 g/liter |
| Sodium hypophosphite | 25 g/liter |
| Lactic acid | 5 g/liter |
| Sodium citrate | 5 g/liter |
| Stabilizer | Small amount |
| pH | 4.0–5.0 |
| Temp. | 80–90° C. |

Note)*:
Palladium and stannous chlorides are each in a colloidal form.

Features of the electroless nickel plating solution are as follows. Hypophosphorous acid serves as a reducing agent in a solution in which a nickel ion is present as a result of dissolution of the nickel salt. It gives rise to such a chemical reaction that the nickel ion is reduced to a metal ion with hypophosphorous acid being oxidized to phosphorous acid. In order to activate this reaction, the solution is adjusted in the pH range of from 4.0 to 5.0, at which hydrophosphorous acid exhibits a high reducing power, and used at a high temperature in the range of from 80° to 90° C.

Thus, according to the present invention, the adoption of electroless nickel plating contributes to an improvement in adhesion of copper plating to the aluminum substrate. Further, it has been found that a higher adhesion can be attained by effecting, instead of mere deposition of electroless Ni plating, a pretreatment, that is, removing an oxide film on the surface of aluminum and then subjecting the surface of aluminum to Ni substitution in an acidic solution of nickel sulfate or nickel chloride or nickel nitrate or the like to form on the surface of aluminum a base coat which enables electroless nickel to be homogeneously grown on the surface of Al, and electrolessly depositing nickel.

Without intending to be bound by theory, it is believed as follows.

Since the surface of aluminum is likely to be oxidized, the resultant oxide film should be removed by alkali or acid cleaning. Even after the oxide film has been removed from the surface of aluminum, electroless nickel is sparsely deposited at intervals of about 4 to 5 $\mu$m as shown in FIG. 1A. For this reason, an electroless nickel film, which has been grown with sparsely deposited nickel serving as nuclei, is rough and, hence, has a poor adhesion to the substrate aluminum (FIG. 1B). On the other hand, Ni substitution under strongly acidic conditions causes the surface of aluminum to be substituted with fine Ni at submicron intervals as shown in FIG. 1C, and this Ni is grown during electroless nickel plating, so that a high adhesion can be attained between nickel and the substrate aluminum (see FIG. 1D).

The oxide film on the surface of aluminum may be removed by acid and/or alkali cleanings. Either acid or alkali cleaning may be used. Since, however, Ni substitution in the subsequent step is carried out under acidic conditions, acid cleaning is preferred. Still preferably, acid cleaning is effected after alkali cleaning. In the alkali or acid cleaning, 2-$\mu$m etching suffices for attaining the purpose of this treatment, that is, removing the oxide film on the surface of aluminum. In general, the treatment may be carried out in a 5 to 30% solution at room temperature for about 0.5 to 1 min.

After the oxide film on the surface of aluminum is removed, the surface of aluminum is subjected to nickel substitution using a nickel salt under acidic conditions. For example, $NiNO_3$, $Ni_2SO_4$, etc., may be used as the nickel salt, the concentration is in the range of from 0.001 to 2M, preferably about 1M, the pH is not higher than 1, the temperature is preferably 50° C. or above for the purpose of accelerating the reaction, and the reaction is continued until an even surface substituted with Ni is formed. In this case, "even film growth" is intended to mean such a state that, as described above, Ni has been evenly deposited at submicron intervals on the surface of aluminum. Since properties of Ni deposited by the Ni substitution are not very good, deposition for an excessively long period of time is not preferred.

After the Ni substitution, electroless nickel plating is carried out. Substantially the entire surface of aluminum should be covered with nickel as a primer for copper plating. In this case, since Ni deposited by the Ni substitution has poor properties, nickel plating is carried out by electroless plating.

Electroless nickel plating is itself known. In the present invention, after a catalyst is first imparted to the multilayer printed wiring board (provided with through-holes), removal of an aluminum oxide film and Ni substitution are effected and the treated wiring board is immersed in an electroless nickel plating solution. The catalyst may be imparted after the completion of the Ni substitution. As described above, substantially the entire surface of the surface of aluminum may be covered with nickel, and the thickness of the nickel plating is generally in the range of from about 1.0 to 5.0 $\mu$m. Since nickel has a higher electrical resistance than copper, it is unfavorable for the nickel plating to have an excessively large thickness.

After the nickel plating, copper plating is carried out. It may be carried out under conventional conditions. The plating thickness is generally in the range of from about 15 to about 30 $\mu$m.

Thus, according to the present invention, a novel printed wiring board is provided. The cross-section of an example of the multilayer printed wiring board thus produced is schematically shown in FIG. 2. Both surfaces of a resin laminate 2 including a plurality of aluminum intermediate layer circuits 1 usually comprise circuits 3 made of a copper foil. A through-hole copper plating layer 6 is formed from the inner wall surface of the through-hole in the laminate onto each copper layer on both surfaces, and an electroless nickel plating layer 5 is present as the primer layer for the through-hole copper plating layer.

In the present invention, since electroless nickel plating is adopted as the primer when the surface of aluminum is electrolessly plated with copper, excellent copper plating becomes possible by virtue of good adhesion of electroless nickel plating to both aluminum and the copper plating. A further improvement in adhesion of the electroless nickel plating to aluminum can be attained by, prior to electroless nickel plating, removing an oxide film on the surface of aluminum and subjecting the surface of aluminum to Ni substitution under strongly acidic conditions.

EXAMPLES

Comparative Example 1

This comparative example illustrates a conventional process for copper plating a multilayer printed wiring board having a copper conductor.

The surfaces of 35 $\mu$m-thick copper foils were roughened with potassium persulfate. Several sheets of a commercially available prepreg with a desired thickness were sandwiched by the roughened copper foils, which were subjected to pressing and heat lamination using a commercially available photosensitive material (a dry film or the like), etching resists were formed on the surfaces of the laminate by photolithography process and unnecessary portions of copper foils were etched by a copper chloride solution to form copper material intermediate layer circuits. Thereafter, commercially available prepegs were put onto the copper foils, and they were subjected to lamination by a conventional method. The laminate was then perforated.

The inside of the holes in the resultant multilayer printed wiring board was washed with high-pressure water and then degreased with a commercially available degreasing agent. Further, Pd/Sn was imparted by using a commercially available catalyst solution (having the above-described composition).

Thereafter, copper was deposited to a thickness of 0.6 μm by using an electroless copper plating solution having the following composition.

| Copper sulfate | 10 g/liter |
| --- | --- |
| EDTA | 30 g/liter |
| Formalin | 10 g/liter |
| pH | 12.5 |
| Stabilizer | very small amount |
| Temp. | 20–25° C. |

Then, electrolytic copper plating was carried out by using a copper plating solution having the following composition to deposit copper to a thickness of 25 μm, thereby completing throughhole plating.

| $H_2SO_4$ | 180–200 g/liter |
| --- | --- |
| $CuSO_4$ | 50–60 g/liter |
| $Cl^-$ | 30 ppm |
| Commercially available brightener | very small amount |
| Solution temp. | 20–22° C. |
| Current density | 1.5–2.0 A/cm$^2$ |

In order to evaluate the quality of the throughhole plating, a structure having a cross section as shown in FIG. 3, wherein 20 consecutive throughholes each having a size of 0.35 mmo were electrically interconnected, was subjected to measurement of electric resistance (initial value). In FIG. 2, numeral 11 designates a substrate, numeral 12 an aluminum conductor, numeral 13 a through-hole plating, and characters A and B each a measuring point. The thickness of the printed wiring board was 1.6 min. Then, solder float (at 260° C. for 5 sec) was repeated thrice, and the electrical resistance was measured (resistance A) as described above. Further, a thermal shock test described in MIL specifications (one cycle consisting of 65° C. for 30 min→25° C. for 5 min→125° C. for 30 min) was carried out 100 cycles, and the electrical resistance was then measured (resistance B).

Figure 4:
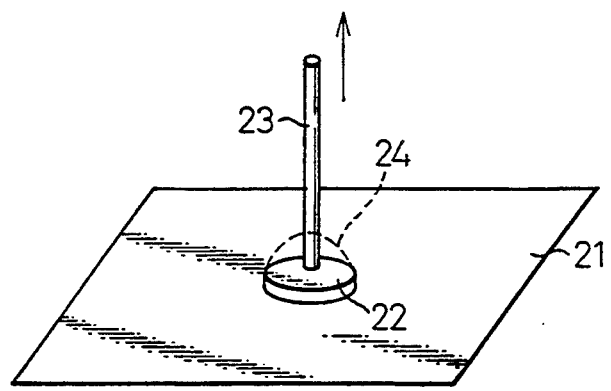
FIG. 4 is an explanatory diagram for a tensile test for evaluating the adhesion of copper plating.

Further, as shown in FIG. 4, a lead 23 was bonded by soldering 24 to a 6-mmo copper-plated layer 22 provided on a copper plate 2i by electroless copper plating followed by electrolytic copper plating under the same conditions as those described above, and the lead 23 was pulled perpendicularly to the copper plate 21 to measure the adhesion of the copper plating to copper.

The results are given in Tables 1 and 2.

Comparative Example 2

This comparative example illustrates copper plating of a multilayer printed wiring board using an aluminum conductor according to a conventional method.

A laminated circuit was prepared and subjected to through-hole plating (copper plating) in the same manner as that of Comparative Example 1, except that 35 μm-thick aluminum foils were used for the intermediate layer of Comparative Example 2, the surface was roughened with 3% caustic soda and dilute hydrochloric acid was used as the etchant.

The multilayer printed wiring board thus prepared was subjected to measurement of electrical resistance as described in Comparative Example 1.

Further, the procedure of Comparative Example 1 was repeated to measure the adhesion of the copper plating on an aluminum plate by the tensile test.

The results are given in Tables 1 and 2.

Example 1.

An aluminum plate was washed with water and degreased, and a catalyst was imparted thereto. Then, nickel was deposited on the aluminum plate to a thickness of 2 μm by using a commercially available electroless nickel plating solution (having the above-described composition).

Thereafter, electrolytic copper plating was carried out as described in Comparative Example 1.

Further, soldering of a lead and a tensile test were carried out as described in Comparative Example 1.

Further, the above-described aluminum plate was heat-treated at 160° C. for 20 min to accelerate a surface oxidation, and plating and a tensile adhesion test were carried out as described above.

The results are given in Table 2.

Example 2

In a multilayer printed wiring board having an aluminum intermediate circuit layer as described in Comparative Example 2, the procedure of Comparative Example 1 was repeated to wash the inside of the throughholes with high-pressure water, effect degreasing and impart a catalyst. Then, alkali and acid cleanings were carried out under the following conditions.

| Alkali cleaning: | |
| --- | --- |
| Caustic soda | 30 g/liter |
| Sodium gluconate | 5 g/liter |
| Room temp., | 1 min |
| Acid cleaning: | |
| Nitric acid | 20% |
| Ammonium fluoride | 50 g/liter |
| Room temp., | 1 min |

| Nickel nitrate | 0.1 mol/l |
| --- | --- |
| Sodium nitrate | 0.5 mol/l |
| pH | Not higher than 1 |
| Temp. | 70° C. |
| Time | 1 min |

Thereafter, electroless nickel plating and electrolytic copper plating were carried out as described in Comparative Example 1.

The multilayer printed wiring board thus prepared was subjected to measurement of electrical resistance as described in Comparative Example 1. The results of observation of the appearance after electroless nickel plating are also given in Table 1.

Example 3

An aluminum plate was subjected to alkali and/or acid cleaning, a Ni substitution, electroless nickel plating and electrolytic copper plating as described in Example 2, and the procedure of Comparative Example 1 was repeated to solder a lead and effect a tensile adhesion test.

In this example, an aluminum plate subjected to a heat treatment (at 160° C. for 20 min) was additionally used, experiments wherein any one or both of the alkali and acid cleanings were omitted were additionally carried out, and nickel substitution conditions (temperature, time and treating solution) were varied.

The results, together with the appearance after electroless nickel plating, are given in Table 2.

TABLE 1

|  | Comp. Ex. 1 | Comp. Ex. 2 | Ex. 2 |
| --- | --- | --- | --- |
| Intermediate layer material | Copper | Aluminum | Aluminum |
| Electroless plating for substrate | Copper | Copper | Nickel |
| Initial value | 38.6 m Ω | 43.4 m Ω | 42.4 m Ω |
| Electrical resistance A, percentage change (%) | 38.4 m Ω −0.52% | 46.2 m Ω +6.45% | 42.2 m Ω −0.47% |
| Electrical resistance B, percentage change (%) | 38.8 m Ω +0.52% | Insulated | 42.4 m Ω 0% | and the Ni substitution could be successfully effected also by using compounds other than nitric acid compounds. In the appearance after electroless nickel plating, "irregular color" means that nickel did not deposit in some portions, and "uneven" means that the surface is uneven to such an extent that the unevenness can be confirmed with the naked eye.

As is apparent from Table 1, when the conventional copper plating (primer electroless copper plating) was applied to a multilayer printed wiring board having an aluminum circuit layer, a lowering in adhesion of plating was so large that the plating was completely peeled off in the endurance test to cause insulation of the circuit. By contrast, the multilayer printed wiring board which had been plated with copper after substrate electroless nickel plating according to the present invention had a property (an adhesion of plating) favorably comparable with the conventional multilayer printed wiring board having a copper circuit layer. In particular, from the MIL thermal shock test, which is an approximately

TABLE 2

| Substrate | Al heat treatment | Alkali cleaning | Acid cleaning | Ni substitution | Adhesion (kg/6 mmφ) | Appearance after electroless Ni plating |
| --- | --- | --- | --- | --- | --- | --- |
| Cu* | — | — | — | — | Not less than 20 | — |
| Al* | Not done | — | — | — | 2.0 | — |
| Al | Not done | Not done | Not done | Not done | 8.0 | Somewhat irregular color surface |
|  | Done |  |  |  | 3.7 | Irregular color surface |
| Al | Not done | Not done | Not done | 70° C., 0.5 min | 18.9 | Even dull surface |
|  | Done |  |  |  | 6.7 | Somewhat irregular color surface |
| Al | Not done | Not done | Done | 70° C., 0.5 min | Not less than 20 | Even dull surface |
|  | Done |  |  |  | 18.5 |  |
| Al | Not done | Done | Done | 70° C., 0.5 min | Not less than 20 | Even dull surface |
|  | Done |  |  |  | Not less than 20 |  |
| Al | Not done | Done | Done | 70° C., 1 min | Not less than 20 | Even dull surface |
|  | Done |  |  |  | Not less than 20 |  |
| Al | Not done | Done | Done | 70° C., 3 min | 16.5 | Even dull surface |
|  | Done |  |  |  | 17.2 | Significantly uneven surface |
| Al | Not done | Done | Done | 40° C., 1 min | 13.1 | Even dull surface |
|  | Done |  |  |  | 12.3 |  |
| Al | Not done | Done | Done | $NiSO_4$ $H_2SO_4$, pH 1 or lower, 70° C., 1 min | Not less than 20 Not less than 20 | Even dull surface |
|  | Done |  |  |  |  |  |

Note)
In Cu* and Al* samples, the primer comprises electroless copper plating.

In Table 2, an adhesion of "not less than 20 kg/6 mmφ" means that application of a tensile force exceeding 20 kg/6 mm gave rise to breaking of the aluminum plate and copper plate which made it impossible to continue the test, that is, the adhesion was satisfactory.

As is apparent from Table 2, when the circuit material was changed from copper to aluminum, the adhesion of copper plating was remarkably lowered from not less than 20 kg/6 mmφ to 2 kg/6 mmφ. However, when the substrate electroless copper plating was changed to electrolytic nickel plating, the adhesion was improved to 8 kg/6 mmφ. Further, when alkali cleaning, acid cleaning and Ni substitution were carried out before the electroless nickel plating, the adhesion was improved to not less than 20 kg/6 mmφ. Further, it was found that the effect attained by a combination of the Ni substitution with the alkali and/or acid cleaning was larger than that attained by the nickel substitution alone, an oxide film present on the surface of aluminum had an effect on this, Ni substitution at about 70° C. exhibited a larger effect than that at 40° C., the adhesion somewhat decreased with an increase in the Ni substitution time 15–20 year accelerated deterioration life test, it can be recognized that, according to the present invention, a sufficiently reliable multilayer printed wiring board using an aluminum material as a circuit material can be produced. It is noted that, according to the MIL specifications, a change in electrical resistance within 10% is acceptable.

According to the present invention, in a printed wiring board having conductors such as an intermediate circuit layer of aluminum and/or a substrate foil as a surface layer, plating of throughholes with copper can be carried out in a high adhesion, which greatly contributes to a reduction in weight and an improvement in reliability of the printed wiring board.

I claim:

1. A wiring board comprising an aluminum conductor as at least a part of conductors, a copper plating provided on at least a part of said aluminum conductor and a nickel layer as a primer for said copper plating and provided on said aluminum conductor.

* * * * *